Jan. 28, 1964 A. SOMLYODY 3,119,950
COUNTER CIRCUIT WITH DIODE MATRIX FEEDING SIGNALS
TO TRANSISTOR SWITCHES WHICH CONTROL
COLD CATHODE INDICATOR
Filed March 22, 1962
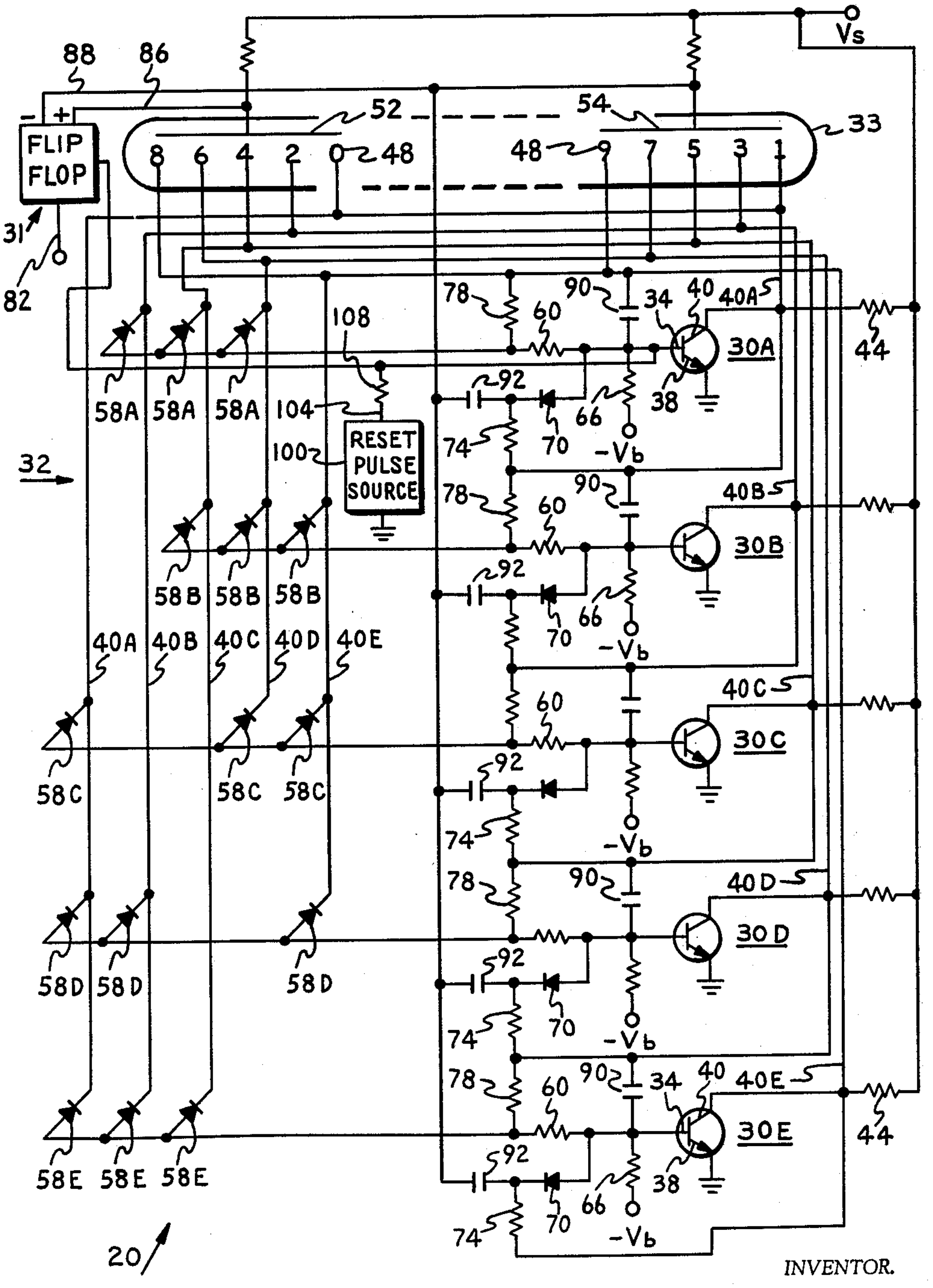
INVENTOR.
ARPAD SOMLYODY
BY Robert A. Green
ATTORNEY United States Patent Office 3,119,950

Patented Jan. 28, 1964

3,119,950

COUNTER CIRCUIT WITH DIODE MATRIX FEEDING SIGNALS TO TRANSISTOR SWITCHES WHICH CONTROL COLD CATHODE INDICATOR

Arpad Somlyody, Raritan, N.J., assignor to Burroughs Corporation, Detroit, Mich., a corporation of Michigan Filed Mar. 22, 1962, Ser. No. 181,731
14 Claims. (Cl. 315—84.6)

This invention relates to electronic counter circuits and particularly to semiconductor counter circuits which include a diode matrix and which operate with binary logic elements and binary-type readout devices to provide decimal readout.

One type of electronic semiconductor counter recently devised utilizes a diode matrix to feed counting signals to a plurality of transistors, or the like, one transistor being provided for each counting step to provide digital or decimal output logic. Such a circuit can be coupled directly to a decimal readout or indicator device to provide a direct visual indication of the counting operation. In this case, the readout device has one indicator element for each transistor or other source of signal information. This type of circuit operates quite satisfactorily.

The circuit of the present invention combines binary circuit logic with a binary indicator device to provide decimal readout of the counting operation. Such a counting circuit has fewer components and is generally simpler in construction than prior art decimal counting circuits.

The objects of the present invention concern the provision of a semiconductor counter utilizing a diode matrix and providing decimal readout from the combination of a binary logic counting circuit and a binary readout device.

Briefly, a counter circuit embodying the invention includes a cold cathode gaseous indicator tube having two anodes and a plurality of cathodes which are connected in pairs to provide two sets of cathodes, each set being associated with one of the anodes. A discharge device, which operates in the nature of a switch, is provided to control the operation of each pair of cathodes, and an auxiliary control means is provided for operating each discharge device and the anodes of the indicator tube. Thus, the control means operates through each discharge device to determine which pair of cathodes is energized and through the anodes of the indicator tube to determine which cathode of each pair is caused to glow.

The discharge devices are adapted to be energized to assume a unique state of conduction; that is, they may be turned either on or off to operate the pairs of cathodes. Circuit means are provided by which each discharge device, when it is turned on or off, holds all of the other discharge devices in the opposite state. In addition, the circuit connections insure that the counting operation proceeds automatically in the correct direction and in the correct order from one discharge device to the next.

The invention is described in greater detail by reference to the single figure of the drawing which is a schematic representation of a counter circuit embodying the invention.

The principles of the present invention are described below with reference to a decade counter which, to provide a cycle of ten counts, includes five circuit logic elements which operate in the nature of switches and perform a binary type of operation. The switch elements are electron discharge devices, preferably semiconductor devices, which are coupled to a readout device having five pairs of indicating elements. In other words, a biquinary semiconductor circuit drives a biquinary indicator device. It will be clear to those skilled in the art that the circuit may include substantially any number of logic elements and the indicator device may include any corresponding number of pairs of indicator elements.

Referring to the drawing, a decade counter circuit 20 embodying the invention includes five electron discharge devices, 30A, 30B, 30C, 30D, 30E, such as transistors, which receive separate counting pulses from a flip-flop 31 and are interrelated through a diode matrix 32. The transistors are shown and described as NPN transistors, but PNP or other transistors might also be used. The transistors are coupled to a biquinary indicator tube 33 which provides a decimal representation of the counting operation, and it is assumed that the counting operation proceeds in order from transistor 30A to 30B to 30C, etc.

Each transistor has base, emitter, and collector electrodes, 34, 38, and 40, respectively, and in each transistor, the emitter electrode 38 is connected to reference potential such as ground, and the collector electrode 40 is connected through a suitable bias resistor 44 to a source of positive D.C. bias potential *Vs*. Each collector electrode is also connected to the indicator tube 33. Since biquinary output signals are provided by the transistors 30, a biquinary indicator tube of the type described and claimed in U.S. Patent No. 2,906,906 is employed to provide the desired conversion to decimal readout. The tube 33 contains a plurality of cold cathode indicator electrodes 48, including the numerals zero to nine, which are electrically connected in two sets, with numerically adjacent cathodes being connected together. Thus, numeral electrodes "0" and "1" are connected together, numerals "2" "3" and are connected together, etc. The tube 33 includes two separate anodes 52 and 54 which are coupled to power supply *Vs* and are operated in conjunction with the other circuit elements, in a manner to be described, to select the proper cathode glow electrode 48 at any instant during the counting cycle.

Each collector electrode 40 is connected to one pair of cathode indicator electrodes in the biquinary tube 33. Thus, the collector of 30A is connected by lead 40A to cathodes "0" and "1"; the collector of 30B, the next in order, is connected by lead 40B to cathodes "2" and "3," etc. Each collector is also coupled through a capacitor 90 to the base electrode of the next adjacent higher order transistor in the counting order. Each collector is also coupled through a diode 58 back to each base electrode except its own and except that of the next adjacent transistor in the counting order. Thus, lead 40A is coupled to the cathodes of diodes 58C, 58D, and 58E, the anodes of which are each connected through resistors 60 to the base electrodes of transistors 30C, 30D, and 30E. Lead 40B is similarly connected through diodes 58A, 58D, 58E and resistors 60 to the base electrodes of transistors 30A, 30D, and 30E, etc.

The base electrode 34 of each transistor is also connected through a suitable bias resistor 66 to a source of negative D.C. bias potential *Vb*. Each base electrode is also connected to the anode of a diode 70, the cathode of which is connected through resistor 74 back to its own collector electrode.

As part of the voltage biasing arrangement for each transistor, a resistor 78 is provided between resistor 74 and resistor 60 so that, in effect, a bleeder network is provided for each transistor extending from source *Vs* through resistors 44, 78, 60, and 66 to *Vb*.

The flip-flop 31 may be of conventional construction using two NPN transistors and includes a single input 82 and two output lines 86 and 88 which are coupled to the anodes 52 and 54 of indicator tube 33, respectively. One of the flip-flop output lines, for example 88, is also coupled through a separate capacitor 92 to each diode 70 and thus to the base electrode of each transistor.

The circuit also includes means for resetting the counter to "0" position and for properly resetting the flip-flop. This means includes a source 100 of positive reset pulses having its output 104 coupled through a resistor 108 to the base electrode of transistor 30A. The output of the reset pulse source is also suitably coupled to the flip-flop 31 to cause the proper transistor to turn on and provide the required potential on output lead 86 to coincide with the turning on of transistor 30A.

In operation of the circuit 20, the counter is set in operation by turning on the first transistor 30A by the application of a positive pulse to its base from the reset pulse source 100. This is arranged to occur simultaneously with the presence of a positive potential on the output 86 of the flip-flop 31, this positive potential being applied to the anode 52 of indicator tube 33. When transistor 30A is turned on, its collector is reduced to about ground potential so that cathodes "0" and "1" are also reduced to about ground potential. Since only anode 52 has a positive potential applied to it, the cathode "0" is caused to exhibit cathode glow. The ground potential on collector 40 of transistor 30A is coupled through the resistors 78 and 60 to the base electrode of transistor 30B which is thereby held off, and this same potential is also coupled through lead 40A and diodes 58C, 58D, and 58E to the base electrodes of the other transistors 30C, 30D, and 30E, which are held off thereby.

When the next counting pulse is applied to the flip-flop 31, the potentials on the output leads are reversed and output lead 88 becomes generally positive and output lead 86 becomes generally negative. However, since the output lead 86 is not connected to any of the transistors, the transistors are not affected by this change and their states are not changed. However, the reverse in flip-flop output potentials also reverses the potentials on the anodes 52 and 54 so that anode 54 is now at a positive potential and anode 52 is at a negative potential. Thus, cathode numeral "1" is caused to exhibit cathode glow. The next counting pulse applied to the flip-flop returns lead 86 to a positive potential and lead 88 to a negative potential. The negative pulse thus appearing on lead 88 is coupled through the capacitor 92 to the base electrode of transistor 30A, which is turned off thereby. When transistor 30A is turned off, its collector electrode 40 rises to a positive potential and this positive potential is coupled through capacitor 90 to the base electrode of transistor 30B, which is thus caused to turn on. When transistor 30B is turned on, its collector electrode 40 is reduced to about ground potential, as are cathodes "2" and "3." Since a positive potential is present on anode 52, cathode "2" exhibits cathode glow. The next counting pulse applied to the flip-flop reverses the potentials on the anodes 52 and 54 and causes cathode numeral "3" to glow. In this manner, each input pulse applied to the flip-flop causes one after the other of the cathodes to glow in order.

The invention described herein provides a novel counter circuit using binary circuit logic and a binary-type readout device to provide decimal visual indication of the counting operation.

What is claimed is:

1. A counter circuit comprising
a cold cathode gaseous indicator tube including a plurality of cathode indicator electrodes connected in pairs,
said tube also including two anodes each being operatively associated with one cathode of each pair of cathodes,
separate switch means coupled to each pair of cathodes for applying an operating potential to both cathodes of a pair at the same time,
said switch means comprising counting devices connected in a series for executing a series of counts,
auxiliary drive means coupled to said anodes for separately energizing each anode at the same time that a switch means applies said operating potential whereby each cathode of a pair may be caused to glow separately,
said drive means also being coupled to each of said switch means for controlling the counting state of each switch means.

2. An electronic counter circuit comprising
a cold cathode gaseous indicator tube including a plurality of cathode indicator electrodes and two anodes,
said cathodes being connected in pairs to provide two sets one associated with one anode and one associated with the other anode,
a transistor for each pair of cathodes,
each transistor having base, emitter, and collector electrodes,
the emitter electrode of each transistor being coupled to a source of reference potential,
the collector electrode of each transistor being coupled to one pair of glow cathodes,
the collector electrode of each transistor also being coupled to the base electrode of a plurality of the other transistors so that when one transistor is in one state of conduction, said plurality of the other transistors are in the opposite state of conduction, and
a flip-flop driver circuit having first and second outputs, the first being coupled to the base electrodes of all of the transistors and the first and second outputs being coupled each to one of the anodes of said indicator tube.

3. A counter circuit including
a chain of counting devices connected to execute a counting cycle including "1" to "$n$" counts,
said counting devices having input and output electrodes,
a plurality of display means for vistually displaying the steps of said counting cycle,
said display means being arrayed in two groups and electrically connected in pairs with each pair including one member of each group,
the output of each counting device being coupled to a different pair of display means so that, as each counting device is switched to the counting state, it applies viewing potentials to each member of the pair simultaneously,
and a flip-flop count pulse generator having first and second outputs each coupled into operative relation with one of said groups of display means whereby each member of a pair of display means which carries viewing potential from a counting device can be rendered separately viewable to display a count in the counting cycle,
said first output of said pulse generator also being coupled to the input of each counting device,
each counting device, as it switches to the counting state, applying viewing potential to a pair of display means and remaining in the counting state while the flip-flop separately energizes and renders viewable each member of the pair of display means energized by the counting device which is in the counting state,
the output of each counting device being coupled to the input of the adjacent counting device in the counting cycle so that as each counting device completes its counting operation, the next adjacent device is automatically energized to perform its counting operation.

4. The circuit defined in claim 3 wherein the output of each counting device is also coupled through a second path to the input of every other device except the next adjacent device so that when one device is in a counting state, it prevents all of the other devices to which its output is coupled from performing a counting operation.

5. The circuit defined in claim 3 wherein the output of each counting device is also coupled through a second path to the input of every other device except the next adjacent device so that when one device is in a counting state, it prevents all of the other devices to which its output is coupled from performing a counting operation, the first output of said flip-flop preventing the adjacent device from performing a counting operation.

6. The circuit defined in claim 3 wherein the output of each counting device is also coupled through a diode to the input of every other device except the next adjacent device so that when one device is in a counting state, it prevents all of the other devices to which its output is coupled from performing a counting operation, the first output of said flip-flop preventing the adjacent device from performing a counting operation.

7. The circuit defined in claim 3 wherein each counting device comprises a transistor which has a base electrode operated as the input electrode, a collector electrode operated as the output electrode, and an emitter electrode which is coupled to a source of reference potential, the collector electrode of each transistor being coupled through a capacitor to the base electrode of the next adjacent transistor in the counting chain so that as each transistor completes its counting operation, it can cause the next adjacent transistor to perform the counting operation, the collector electrode of each transistor also being coupled to the base electrode of every other transistor except the one next adjacent to it so that as each transistor performs a counting operation, it prevents all other transistors to which it is connected from performing the counting operation.

8. The circuit defined in claim 3 wherein said display means comprises a cold cathode gaseous indicator tube having two groups of glow cathodes, said tube also including two anodes, each being in operative relation with one of the groups of cathodes and each adapted to cause the cathodes in one of the groups to glow, said cathodes being connected in pairs with one cathode in each group being in a pair, the output of each of said counting devices being connected to one pair of glow cathodes, the outputs of said flip-flop being coupled one to each anode so that when a counting device applies viewing potential to a pair of glow cathodes, the flip-flop then causes each cathode of the pair to glow.

9. The circuit defined in claim 1 wherein said auxiliary drive means applies counting signals to the circuit and the coupling of said auxiliary drive means to each switch means is such that a switch means remains in the counting state while the auxiliary drive means applies two counting signals, the second counting signal driving the counting switch means to a non-counting state at which time the next adjacent switch means enters the counting state, each switch means also being coupled through two paths, one of which couples a switch means to the next adjacent switch means in the counting cycle so that as a switch means is driven from the counting state to the non-counting state, it drives a next adjacent switch means to the counting state, the other of which couples each switch means to all but the next adjacent switch means so that each switch means which is in a counting state prevents all other switch means to which it is connected from entering the counting state.

10. The circuit defined in claim 1 wherein said auxiliary drive means applies counting signals to the circuit and the coupling of said auxiliary drive means to each switch means is such that a switch means remains in the counting state while the auxiliary drive means applies two counting signals, the second counting signal driving the counting switch means to a non-counting state, each switch means also being coupled to the next adjacent switch means in the counting cycle so that, as a switch means is driven from the counting state to the non-counting state, it drives the next adjacent switch means to the counting state.

11. The circuit defined in claim 1 wherein said auxiliary drive means applies counting signals to the circuit and the coupling of said auxiliary drive means to each switch means is such that a switch means remains in the counting state while the auxiliary drive means applies two counting signals, after which the auxiliary drive means switches a counting switch means to a non-counting state at which time the next adjacent switch means enters the counting state, each switch means having an input and an output, the output of each switch means being coupled to two separate current flow paths, one path coupling the output of each switch means to the input of the next adjacent switch means in the counting cycle so that as a switch means is driven from the counting state to the non-counting state, it drives the next adjacent switch means to the counting state, the other path coupling the output of each switch means to the input of all but the next adjacent switch means so that each switch means which is in a counting state prevents all other switch means to which it is connected from entering the counting state.

12. The circuit defined in claim 1 wherein said auxiliary drive means applies counting signals to the circuit and the coupling of said auxiliary drive means to each switch means is such that a switch means remains in the counting state while the auxiliary drive means applies two counting signals, after which the auxiliary drive means switches a counting switch means to a non-counting state at which time the next adjacent switch means enters the counting state, each switch means having an input and an output, the output of each switch means being coupled to two separate current flow paths, one path coupling the output of each switch means through a capacitor to the input of the next adjacent switch means in the counting cycle so that as a switch means is driven from the counting state to the non-counting state, it drives the next adjacent switch means to the counting state, the other path coupling the output of each switch means through a diode to the input of all but the next adjacent switch means so that each switch means which is in a counting state prevents all other switch means to which it is connected from entering the counting state.

13. A counter circuit comprising a cold cathode gaseous indicator tube including a plurality of cathode indicator electrodes connected in pairs, said tube also including two anodes each being operatively associated with one cathode of each pair of cathodes, a separate transistor coupled to each pair of cathodes for applying an operating potential to both cathodes of a pair at the same time, and a flip-flop drive means coupled to said anodes for separately energizing each anode at the same time that a transistor applies said operating potential to a pair of cathodes whereby each cathode may be caused to glow separately, said flip-flop also being coupled to said transistors for energizing each one separately to apply said operating potential to said cathodes, each transistor including an input electrode and an output electrode, the flip-flop being coupled to the input electrode of each transistor, the output electrode of each transistor being coupled through a diode to the input electrode of each transistor except its own input and that of the next adjacent transistor in the counting chain, and the output electrode of each transistor being coupled to the input electrode of the next adjacent transistor in the counting chain whereby the count is automatically transferred from one transistor to the next.

14. A counter circuit comprising a cold cathode gaseous indicator tube including a plurality of cathode indicator electrodes connected in pairs, said tube also including two anodes each being operatively associated with one cathode of each pair of cathodes, a separate transistor coupled to each pair of cathodes for applying an operating potential to both cathodes of a pair at the same time, and a flip-flop drive means coupled to said anodes for separately energizing each anode at the same time that a transistor applies said operating potential to a pair of cathodes whereby each cathode may be caused to glow separately, said flip-flop also being coupled to said transistors for energizing each one separately to apply said operating potential to said cathodes, each transistor including an input electrode and an output electrode, the flip-flop being coupled to the input electrode of each transistor, the output electrode of each transistor being coupled through a diode to the input electrode of each transistor except its own input and that of the next adjacent transistor in the counting chain, and the output electrode of each transistor being coupled to the input electrode of the next adjacent transistor in the counting chain whereby the count is automatically transferred from one transistor to the next, said flip-flop including two output lines, one of which is connected to one anode of said tube and the other of which is connected both to the other anode and to the input electrodes of said transistors.

References Cited in the file of this patent

UNITED STATES PATENTS

| | | |
|---|---|---|
| 2,906,906 | McCauley et al. | Sept. 29, 1959 |
| 2,982,880 | Klipstein | May 2, 1961 |